United States Patent
Iwai

(10) Patent No.: US 8,729,780 B2
(45) Date of Patent: May 20, 2014

(54) PIEZOELECTRIC VIBRATING PIECES AND CORRESPONDING DEVICES EXHIBITING REDUCED VIBRATION LEAKAGE

(75) Inventor: Hiroki Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 556 days.

(21) Appl. No.: 13/069,691

(22) Filed: Mar. 23, 2011

(65) Prior Publication Data

US 2011/0241495 A1  Oct. 6, 2011

(30) Foreign Application Priority Data

Mar. 31, 2010  (JP) .................................. 2010-079997

(51) Int. Cl.
  *H03H 9/21*  (2006.01)
(52) U.S. Cl.
  CPC ..................................... *H03H 9/21* (2013.01)
  USPC ........................................................ 310/370
(58) Field of Classification Search
  CPC ............ H03H 9/19; H03H 9/21; H03H 9/215
  USPC .............................. 310/370; 333/200; 331/158
  See application file for complete search history.

(56) References Cited

U.S. PATENT DOCUMENTS

| 8,134,284 | B2 * | 3/2012 | Kawanishi | 310/370 |
| 2009/0077781 | A1 * | 3/2009 | Amano | 29/25.35 |
| 2009/0167118 | A1 * | 7/2009 | Yoshimatsu et al. | 310/370 |
| 2010/0156237 | A1 * | 6/2010 | Ichikawa et al. | 310/312 |
| 2011/0227672 | A1 * | 9/2011 | Yamada | 333/200 |

FOREIGN PATENT DOCUMENTS

| JP | 2005-102138 | 4/2005 |
| JP | 2008-098909 | 4/2008 |
| JP | 2009-016988 | 1/2009 |
| JP | 2009-081521 | 4/2009 |
| JP | 2009-164777 | 7/2009 |
| JP | 2009164777 A * | 7/2009 |
| JP | 2009-206614 | 9/2009 |
| JP | 2010-004456 | 1/2010 |
| JP | 2010-074751 | 4/2010 |

OTHER PUBLICATIONS

Office Action for related Japanese Patent Application No. 2010-079997, 5 pages, dated Apr. 17, 2012.

* cited by examiner

*Primary Examiner* — J. San Martin
(74) *Attorney, Agent, or Firm* — Klarquist Sparkman, LLP

(57) ABSTRACT

Piezoelectric vibrating pieces are disclosed that include a base, a pair of vibrating arms, and a pair of supporting arms. The base is fabricated of piezoelectric material. The vibrating arms extend straight from the base in a designated longitudinal direction and having a first thickness. A respective supporting arm extends straight from the base and outboard of each vibrating arm in the designated longitudinal direction. Each supporting arm includes at least a respective second region that has second thickness different from the first thickness.

8 Claims, 11 Drawing Sheets

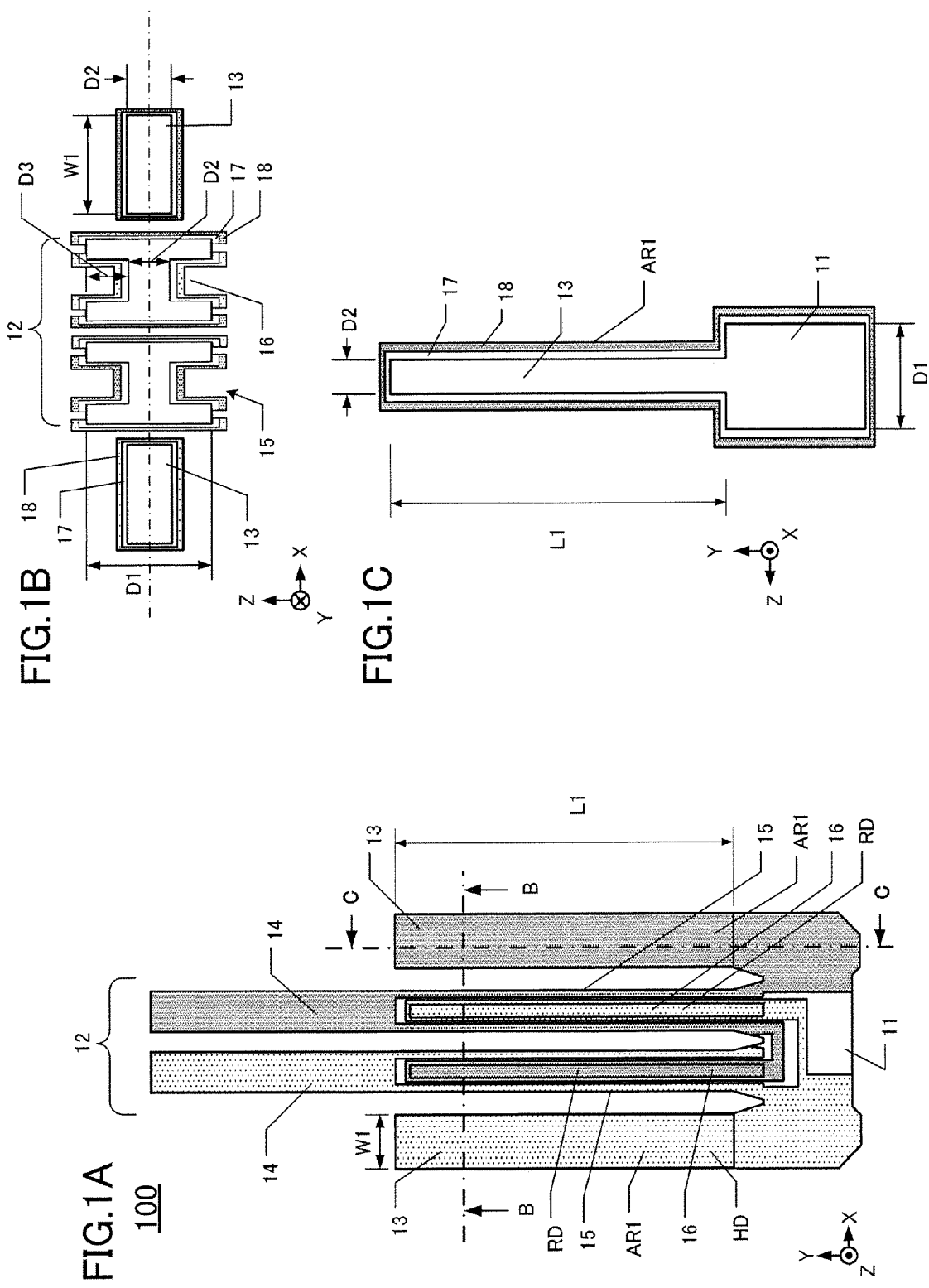

FIG.4
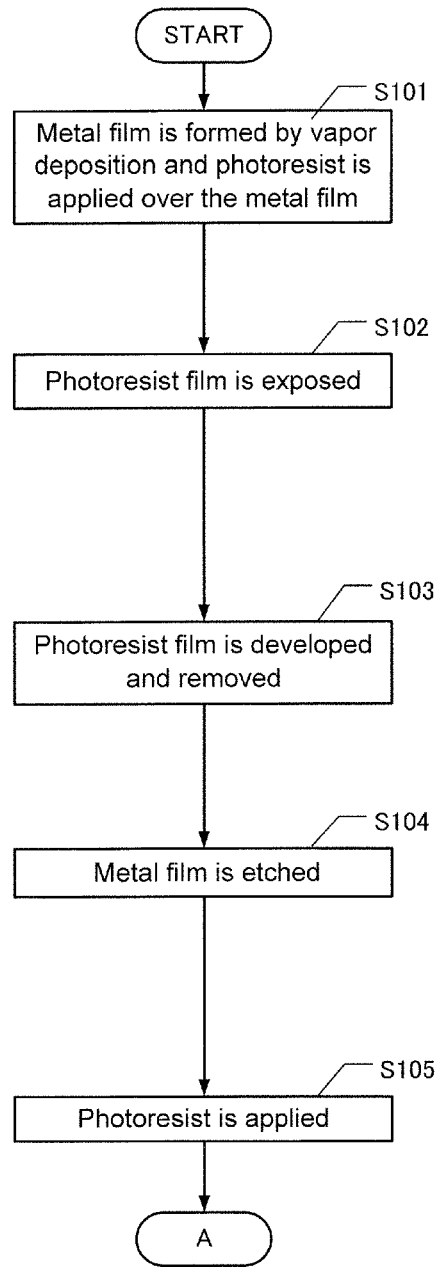
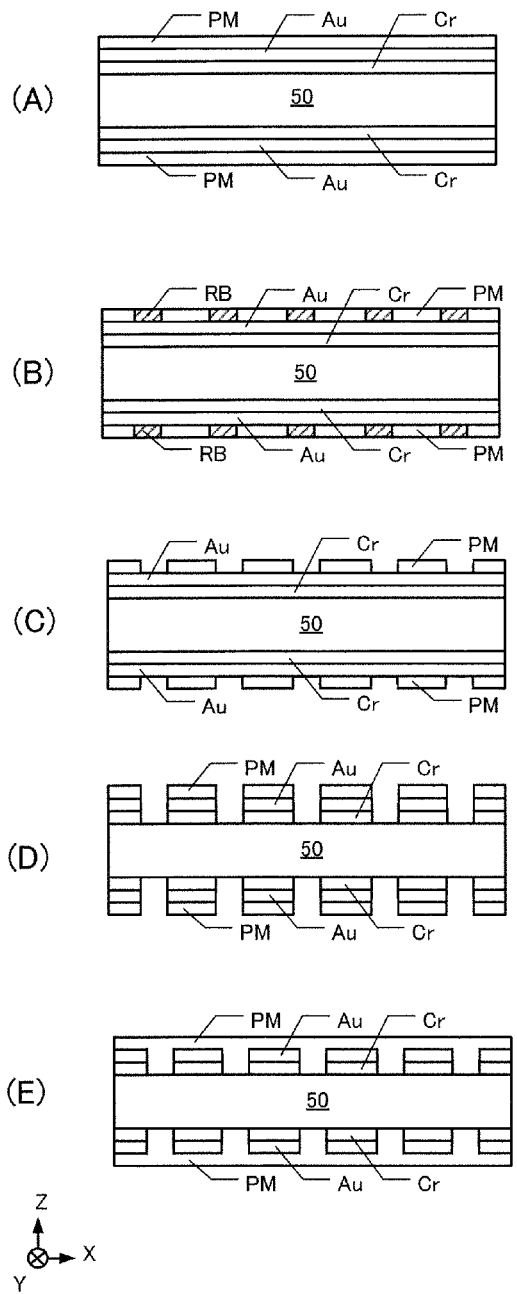

FIG.5
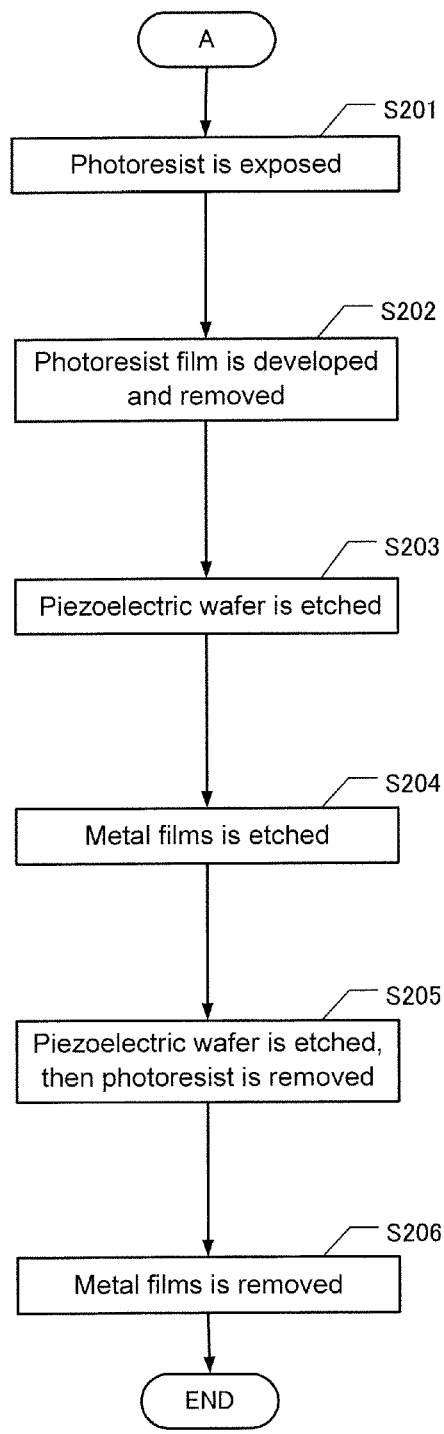
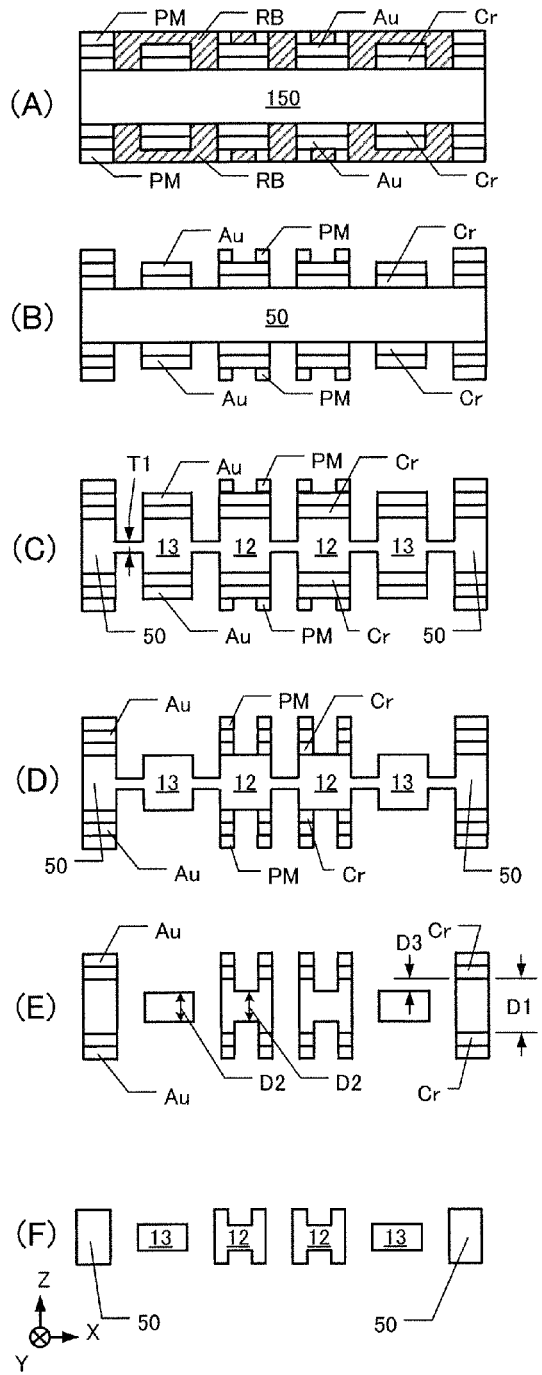

FIG.7
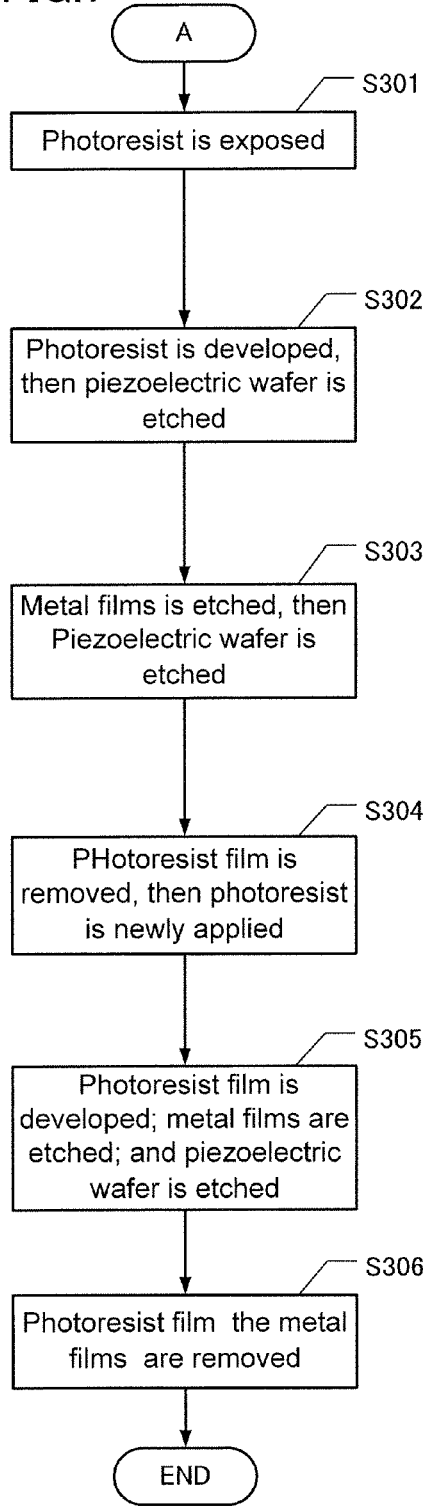
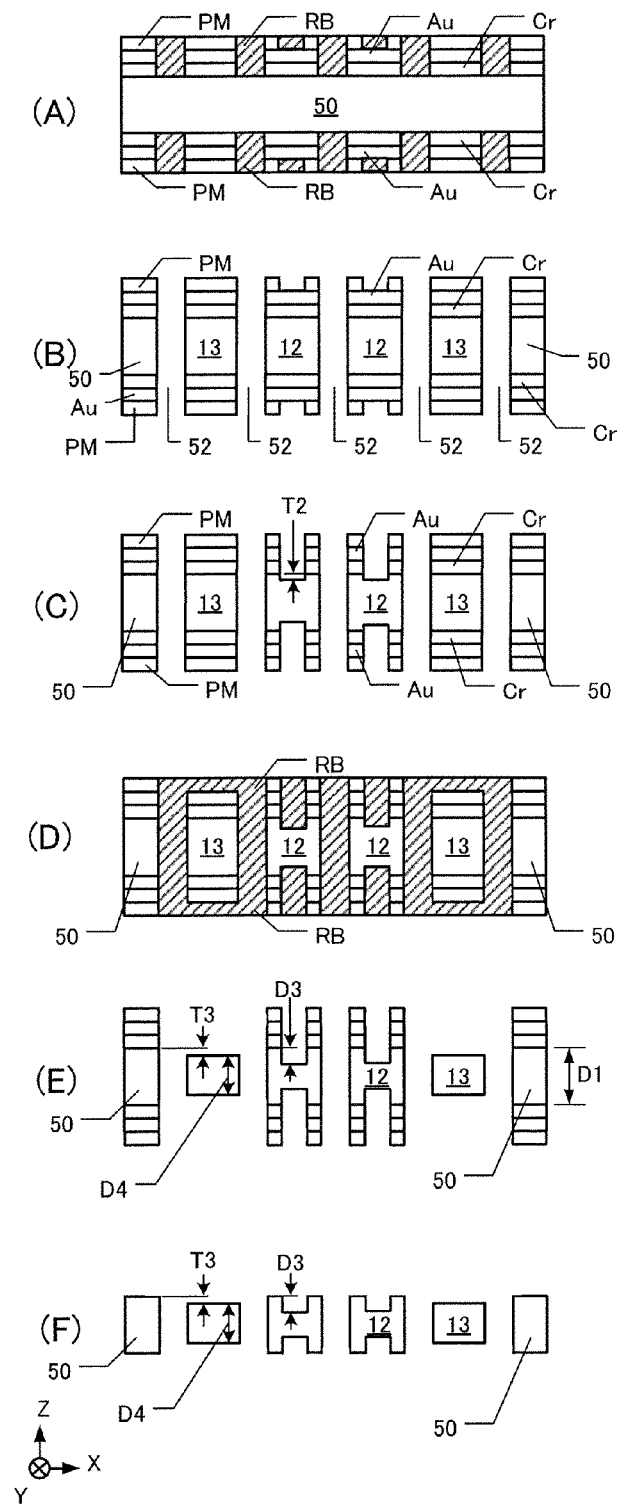

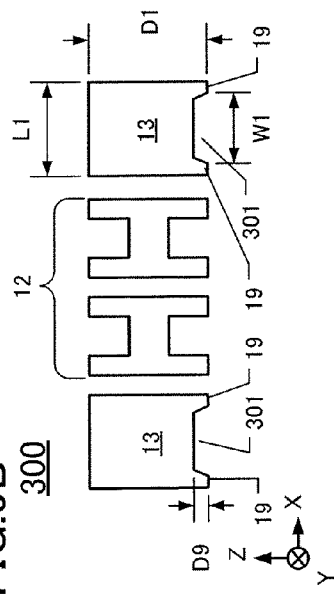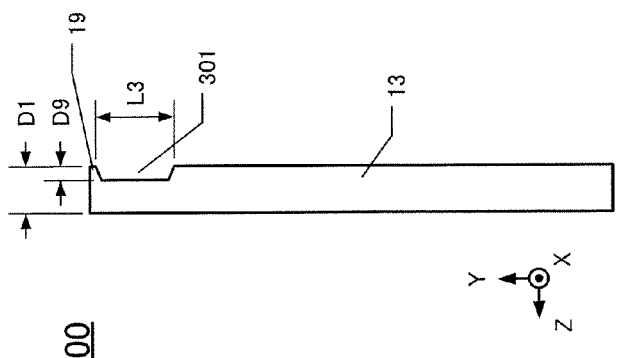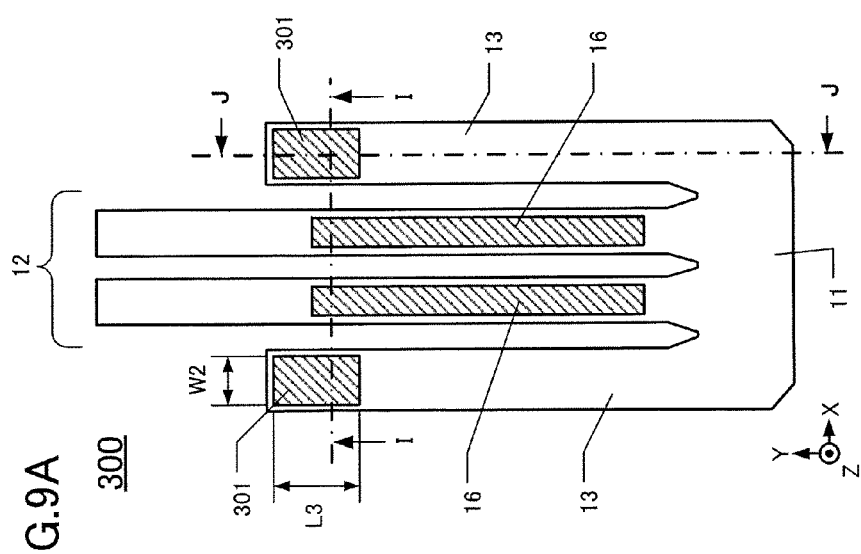

310

310

320

320

(d)

PIEZOELECTRIC VIBRATING PIECES AND CORRESPONDING DEVICES EXHIBITING REDUCED VIBRATION LEAKAGE

CROSS-REFERENCE TO RELATED APPLICATION

This application claims priority to and the benefit of Japan Patent Application No. 2010-079997 filed on Mar. 31, 2010, in the Japan Patent Office, the disclosure of which is incorporated herein by reference in its entirety.

FIELD

This disclosure relates to, inter alia, piezoelectric vibrating pieces having supporting arms of variable thickness. The disclosure also relates to piezoelectric devices incorporating such piezoelectric vibrating pieces, and to methods for manufacturing such piezoelectric vibrating pieces.

DESCRIPTION OF THE RELATED ART

Tuning-fork type piezoelectric vibrating pieces having a pair of vibrating arms extending from one end of a base are known. Whenever a driving voltage is applied to the tuning-fork type piezoelectric vibrating piece, the vibrating arms exhibit bending vibrations due to the piezoelectric effect, in which the arms periodically flex toward and away from each other. One example of a tuning-fork type piezoelectric vibrating piece vibrates (bending vibrations) at a resonance frequency of 32.768 kHz. As piezoelectric vibrating pieces have been progressively miniaturized, they are more likely to exhibit vibration leakage (sonic leakage) from the vibrating aims to the base. To reduce these vibration leakages, piezoelectric vibrating pieces have been provided with supporting arms situated outboard of the vibrating arms.

In conventional piezoelectric vibrating pieces in which the supporting arms are structured similarly to the vibrating arms, the supporting arms sometimes exhibit spurious (and unnecessary) vibrations. The spurious vibrations are usually generated where the supporting arms are connected to the base. If these spurious vibrations are at frequencies close to the resonance frequencies of the vibrating arms, the vibrations of the vibrating arms become unstable, which causes increased CI values and variations in output frequencies.

Piezoelectric vibrating pieces as discussed in Japan Patent Publication No. 2008-098909 comprise "weights" on the distal ends of the supporting arms. The weights comprise metal layers that shift the resonance frequencies of spurious vibrations away from the resonance frequencies of the vibrating arms. Piezoelectric vibrating pieces according to this reference also include a weight-contributing electrode in addition to the metal layer on the extraction electrode extending from the excitation electrode formed on the vibrating arms to the supporting arms.

SUMMARY

This disclosure is directed to several aspects of the invention. According to a first aspect, piezoelectric vibrating pieces are provided. An exemplary embodiment of the piezoelectric vibrating piece comprises a base, a pair of vibrating arms, and a pair of supporting arms. The base and vibrating arms are fabricated from piezoelectric material. The vibrating arms have a first thickness and extend straight from the base in a designated longitudinal direction. Each supporting arm has at least one region of a second thickness that is different from the first thickness, and extends straight from the base and then in the designated longitudinal direction outboard of the respective vibrating arm.

The supporting arms can be respective portions of the piezoelectric vibrating piece that have only the second thickness. I.e., in some embodiments each supporting arm is entirely the second thickness that is different from the first thickness.

In other embodiments each supporting arm includes a first area having the first thickness and a second area having the second thickness.

In some embodiments the vibrating arms have respective excitation grooves extending straight in the designated direction and respective excitation electrodes situated in the excitation grooves. The supporting arms include respective extraction electrodes that are connected to respective excitation electrodes and that extend from the base to the distal ends of the supporting arms.

In some embodiments the second thickness (e.g., in the second region) is less than the first thickness (e.g., in the first region). In these embodiments each supporting arm can include a respective supporting-arm groove formed between the first region and the second region. Each extraction electrode is situated in at least a portion of the respective supporting-arm groove.

In many embodiments the piezoelectric vibrating piece comprises a frame body that circumferentially surrounds the pair of supporting arms and the base. A respective connecting arm connects the frame body to each supporting arm, wherein the supporting arms and connecting arms are integrally formed.

According to another aspect, piezoelectric vibrating devices mountable to a printed circuit board are provided. An exemplary embodiment comprises a package defining a cavity to house the piezoelectric vibrating piece. The package comprises external electrodes that are mountable on a printed circuit board. The cavity contains, in addition to the piezoelectric vibrating piece, a respective connecting electrode connected to each external electrode. The supporting arms of the piezoelectric vibrating device including respective supporting-arm grooves formed in accordance with the shapes of the respective connecting electrodes.

Another aspect is directed to methods for manufacturing piezoelectric pieces that include a base formed from piezoelectric material, a pair of vibrating arms, and a pair of supporting arms. Each vibrating arm has a first thickness and extends straight from the base in a designated longitudinal direction. Each supporting arm includes at least a region having a second thickness that is different from the first thickness. Each supporting arm extends straight from the base and then outboard of the respective vibrating arm in the designated longitudinal direction. In the method, respective excitation grooves are formed on the vibrating arms. The excitation grooves provide respective regions of the vibrating arms having the second thickness, wherein the second thickness is less than the first thickness. Also, respective second regions are formed on the supporting arms. These reduced-thickness regions, including grooves desirably are formed by etching. Multiple etching steps can be performed simultaneously.

From the various aspects summarized above, piezoelectric vibrating pieces are provided that vibrate at stable resonance frequencies, which is achieved by, inter alia, changing the thickness of the supporting arms. Another benefit is greater shifting of the resonance frequencies of spurious vibrations of the supporting arms from the resonance frequencies of the vibrating arms.

BRIEF DESCRIPTION OF THE DRAWINGS

FIG. 1A is a plan view of a first embodiment of a piezoelectric vibrating piece.

FIG. 1B is a cross-sectional view along the line B-B in FIG. 1A.

FIG. 1C is a cross-sectional view along the line C-C in FIG. 1A.

FIG. 4 is a flow-chart of an embodiment of a process for forming the metal film and photoresist.

FIGS. 4(A)-4(E) depict respective results of corresponding steps described immediately to the left in FIG. 4. The results are as viewed along the line F-F in FIG. 3B.

FIG. 5 is a continuation of the flow-chart of FIG. 4, including steps for etching the piezoelectric wafer.

FIGS. 5(A)-5(F) depict respective results of corresponding steps described immediately to the left in FIG. 5.

FIG. 7 is a flow-chart of an embodiment of a process for manufacturing the first example of the first embodiment of a piezoelectric vibrating piece (FIG. 6A).

FIGS. 7(A)-7(F) depict respects results of corresponding steps described immediately to the left in FIG. 7.

FIG. 9A is a plan view of a third embodiment of a piezoelectric vibrating piece 300.

FIG. 9B is a cross-sectional view, along the line I-I in FIG. 9A, of the third embodiment of a piezoelectric vibrating piece.

FIG. 9C is a cross-sectional view along the line J-J in FIG. 9A, of the third embodiment of a piezoelectric vibrating piece.

DETAILED DESCRIPTION

Figure 2A:
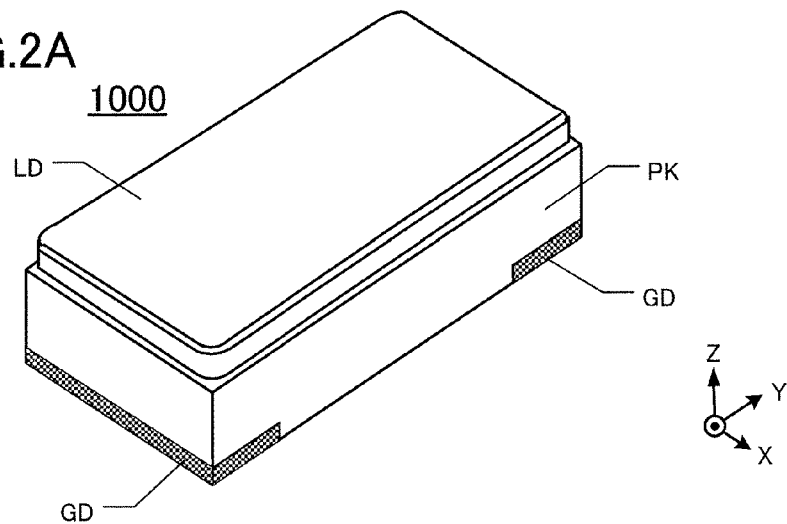
FIG. 2A is an oblique perspective view of a first embodiment of a piezoelectric device.

The following is a detailed description of various exemplary embodiments, set forth with reference to the accompanying drawings. It will be understood that the scope of the invention is not limited to the specific embodiments described herein, unless expressly stated otherwise.

First Embodiment of Piezoelectric Vibrating Piece

In this first embodiment, the subject tuning-fork type piezoelectric vibrating piece 100 comprises a base and supporting arms, wherein the supporting arms have variable thickness that is different from the thickness of the base. See FIGS. 1A-1C.

FIG. 1A is a plan view of this embodiment 100. The subject piezoelectric vibrating piece 100 is a tuning-fork type piezoelectric vibrating piece comprising a base 11 and a pair of vibrating arms 12 extending parallel to each other from the base 11. The piezoelectric vibrating piece 100 also comprises a pair of supporting arms 13. Each supporting arm 13 extends parallel to and outboard of the respective vibrating arm 12. Herein, the direction in which the vibrating arms 12 extend is referred to as the Y-axis direction, the direction in which the vibrating arms are lined up is referred to as the X-axis direction, and the direction perpendicular to the X-axis and Y-axis is referred to as the Z-axis direction.

The vibrating arms 12 are connected (at their −Y-axis ends) to the base 11 and extend straight in the +Y-axis direction. The supporting arms 13 are also connected (at their −Y-axis ends) to the base 11 and extend straight in the +Y-axis direction. "Extending straight" means that the vibrating arms 12 and the supporting arms 13 bend toward neither the X-axis nor the Z-axis.

The vibrating arms 12 have weights 14 located at their distal +Y ends. The weights stabilize vibrations of the vibrating arms 12 and of groove regions 15 thereof at the −Y ends of the vibrating arms. Respective excitation grooves 16, extending straight and parallel in the Y-axis direction, are situated on both main surfaces (+Z-axis main surface and −Z-axis main surface) of the groove regions 15. Each supporting arm 13 has an area AR1 in which the thickness (in the Z-axis direction) differs from the thickness of the base 11. The width of the areas AR1 in the X-axis direction is denoted W1, and the length of the areas AR1 in the Y-axis direction is denoted L1.

An exemplary thickness D1 of the base 11 of the piezoelectric vibrating piece 100 is between 0.08 and 0.12 mm. An exemplary thickness of each area AR1 of the supporting arms 13 is 0.08 mm. An exemplary width W1 of each area AR1 is between 50 and 100 μm, and an exemplary length L1 thereof is between 300 and 400 μm.

The piezoelectric vibrating piece 100 comprises a piezoelectric board AK providing a substrate made of piezoelectric material. Electrodes are formed on the main surfaces of the piezoelectric board AK. The electrodes comprise excitation electrodes RD formed in the groove regions 15, extraction electrodes HD extending from respective excitation electrodes RD to respective supporting arms 13 through respective weights 14 and the base 11. FIG. 1A uses different hatching patterns to display the respective electrodes formed on the piezoelectric vibrating piece 100 that are not electrically connected to each other.

FIG. 1B is a cross-sectional view of the piezoelectric vibrating piece 100 along the line B-B in FIG. 1A. FIG. 1B is a cross-sectional view of the groove regions 15 on the vibrating arms 12 and a cross-sectional view of the supporting arms 13. On the vibrating arms 12, respective excitation grooves 16 are situated on the +Z-axis side and the −Z-axis side of the groove regions 15. Each vibrating arm 12 in these regions has an H-shaped cross-section. The thickness D1 of each vibrating arm 12 is equal to the thickness of the base 11. The thickness D2 of each supporting arm 13 is equal to the thickness of a vibrating arm 12 in the region including the excitation grooves 16. Therefore, denoting the depth of an excitation groove 16 as D3, the thickness D1 of the vibrating arm 12 is: D1=D2+D3.

Respective electrodes are formed on the vibrating arms 12 and on the supporting arms 13. More specifically, a respective electrode is formed in each excitation groove 16 and on each side of each vibrating arm 12 in the groove region 15. On a given vibrating arm 12, these electrodes are not connected to each other electrically. The electrodes can be made of any of various metals, including gold, but these metals do not firmly adhere to the underlying piezoelectric material. Consequently, each electrode comprises a respective foundation layer 17 formed on the surface of the piezoelectric material beneath the respective metal layer. Exemplary piezoelectric materials are crystal materials (e.g., quartz crystal), lithium tantalate, and lithium niobate. The foundation layers 17 can be Cr, Ni, or the like. The metal layers 18 can be Au, Ag, or the like.

FIG. 1C is a cross-section of the piezoelectric vibrating piece 100 along the line C-C in FIG. 1A. The thickness of each area AR1 of a supporting arm 13 is denoted D2, and the length of a supporting arm in the Y-direction is denoted L1. Note that D2<D1, wherein D1 is the thickness of the base 11.

First Embodiment of a Piezoelectric Device

Figure 2B:
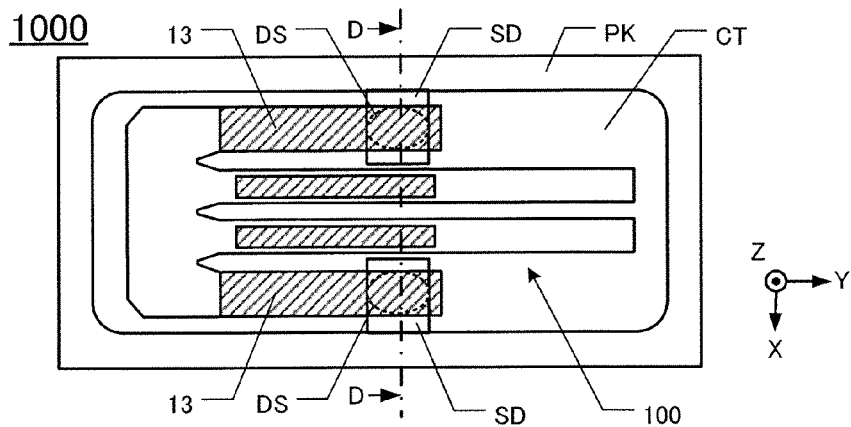
FIG. 2B shows the piezoelectric device of FIG. 2A as viewed from the +Z-axis to the −Z-axis.
Figure 2C:
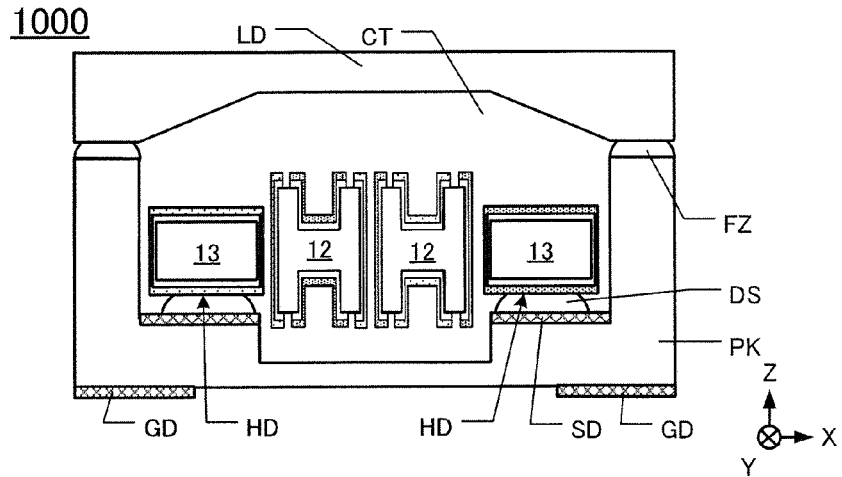
FIG. 2C is a cross-sectional view along the line D-D in FIG. 2B.

For use, each piezoelectric vibrating piece 100 is assembled in a package to produce a piezoelectric device. An embodiment 1000 of a piezoelectric device is shown in FIGS. 2A-2C. FIG. 2A is an oblique perspective figure of the piezoelectric device 1000, FIG. 2B shows the piezoelectric device 1000 as viewed from above (i.e., from a location on the +Z-axis), and FIG. 2C is a cross-sectional view along the line D-D in FIG. 2B.

Turning first to FIG. 2A, the piezoelectric device 1000 comprises a package PK, a lid LD, and the piezoelectric piece 100. The package PK is a concave box made of ceramic as a base material. The lid LD seals the package PK. The package PK has an external main surface on which external electrodes GD are formed. The piezoelectric vibrating piece 100 is contained inside the package PK.

FIG. 2B shows the piezoelectric device 1000 as viewed from a location in the +Z-axis direction toward the −Z-axis direction after removal of the lid LD. The hatching in FIG. 2B is different from the hatching in FIG. 2A; in FIG. 2B the hatching indicates the areas of the piezoelectric vibrating piece 100 having thickness D2. The piezoelectric vibrating piece 100 is mounted in the package PK by bonding the distal-end regions of each supporting arm 13 to the respective connecting electrode SD inside the package PK, using electrically conductive adhesive DS.

FIG. 2C is a cross-sectional view of the piezoelectric device 1000 along the line D-D in FIG. 2B. The lid LD is aligned with and sealed to the package PK using a bonding sealant FZ. As noted above, the piezoelectric vibrating piece 100 is electrically connected to the package PK via the conductive adhesive DS which connects the distal-end regions of the supporting arms 13 to the respective connecting electrodes SD. This implies that the extraction electrodes HD, located at the distal-end regions of the supporting arms 13, are electrically connected to respective connecting electrodes SD. Since the connecting electrodes SD are electrically connected to respective external electrodes GD via conductors (not shown) in the package PK, the extraction electrodes HD are electrically connected to respective external electrodes GD.

The main vibrations of the vibrating arms 12 are in the X-direction owing to the electric field established between the electrodes formed on the edge sides of the vibrating arms and the respective excitation electrodes RD. Along with these main vibrations are unnecessary vibrations (spurious vibrations) that are also natural vibrations of the vibrating arms 13. If the resonance frequencies of the spurious vibrations are close to the resonance frequencies of the main vibrations, undesirable mode coupling occurs, in which vibrations become unstable. Mode coupling tends to increase CI values and cause errors in output frequencies. The piezoelectric vibrating piece 100 of this embodiment increases the difference in resonance frequencies between the spurious vibrations and the main vibrations by making the supporting arms 13 thinner, which increases the resonance frequencies of the spurious vibrations. Thus, the piezoelectric vibrating piece 100 can suppress mode coupling, reduce CI, and reduce output-frequency errors. The piezoelectric vibrating piece 100 can also suppress vibration leakage (acoustic leakage) by changing the thickness of the supporting arms 13 relative to the thickness of either the base 11 or the vibrating arms 12, which inhibits transfer of spurious vibrations to the vibrating arms 12. The piezoelectric vibrating piece 100 mainly deals with spurious vibrations in the X-direction, but the common mode of vibrations in the Z-direction also can be suppressed.

Method for Manufacturing Piezoelectric Vibrating Piece

During manufacture of the piezoelectric vibrating piece 100, etching of the supporting arms 13 to adjust their thickness is performed simultaneously with etching of the vibrating arms 12 to form the excitation grooves 16. Therefore, the thickness of the supporting arms 13 can be reduced without increasing manufacturing cost. Fabrication of the piezoelectric vibrating piece 100 is described below, with reference to FIGS. 3-5.

Figure 3A:
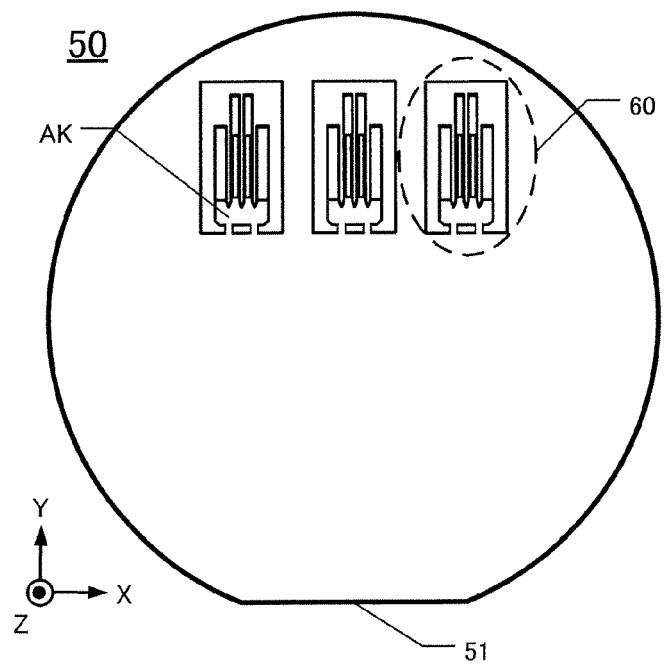
FIG. 3A is a plan view of an exemplary piezoelectric wafer on which multiple piezoelectric vibrating pieces are formed simultaneously.

FIG. 3A is a plan view of a piezoelectric wafer 50. An orientation flat 51 is formed on the periphery of the piezoelectric wafer 50 to identify the crystal orientation of the wafer. An exemplary piezoelectric wafer 50 comprises a Z-cut quartz plate of approximately 0.12 mm in thickness and having a diameter of 3 or 4 inches. More than one piezoelectric vibrating piece 100 is formed on a single piezoelectric wafer 50. FIG. 3A shows an example of three piezoelectric boards AK formed on the wafer. The region circumscribed by a dashed line 60 represents a single piezoelectric board AK.

Figure 3B:
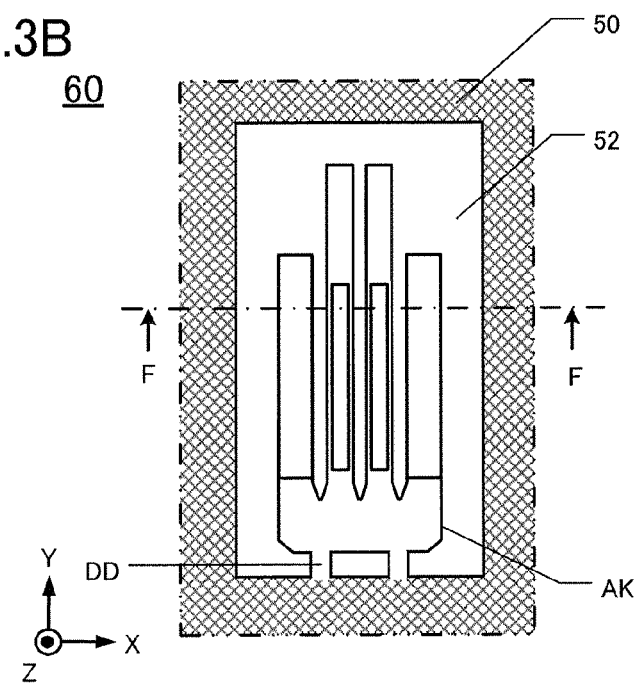
FIG. 3B is an enlargement of the area enclosed by the dashed line in FIG. 3A.

FIG. 3B is an enlargement of the area enclosed by the dashed line 60 in FIG. 3A. The plan profile of each piezoelectric board AK is defined on the wafer 50 by a through-channel 52 that penetrates fully through the thickness dimension of the piezoelectric wafer 50. At this point, the piezoelectric board AK is connected to the piezoelectric wafer 50 by a respective connecting portion DD. This manner of connecting multiple piezoelectric vibrating pieces to the wafer 50 preserves the planarity of the wafer and forms an electrode, which allows a large quantity of piezoelectric vibrating pieces 100 to be manufactured simultaneously.

FIG. 4 is a flow-chart of an embodiment of a method for forming a metal film and performing photolithography. FIGS. 4(A)-4(E) are respective cross-sections of the piezoelectric board AK along the line F-F in FIG. 3B to show the process by which the piezoelectric boards AK are formed.

During Step S101 a metal film is formed over the entire piezoelectric wafer 50 by vapor-deposition or spattering, followed by application of photoresist over the metal film. The metal film desirably comprises a gold (Au) layer on a layer of chromium (Cr). The Cr layer is formed over the piezoelectric wafer 50 and then the Au layer is formed over the Cr layer. A layer of photoresist is applied over the gold layer by spin-coating or other technique to form a photoresist film PM. See FIG. 4(A).

During Step S102, the photoresist film is exposed to light that has passed through a photomask. See FIG. 4B. In this exposure the through-holes 52 are used as corresponding exposure windows for the exposure. FIG. 3(B) more specifically shows use of a photomask (not shown) in the region in which the outer profile of the piezoelectric piece 100 is formed, to form the exposed portions RB on the photoresist film PM.

During Step S103, the photoresist film RM is developed to remove the exposed portion RB. See FIG. 4(C).

During step S104, the metal layers (including Au and Cr) located beneath exposed regions of exposed photoresist RM are removed by etching during Step S103. See FIG. 4(D). By way of example, the Au layer can be etched using an aqueous solution of iodine and potassium iodide, or the like, and the Cr layer can be etched by an aqueous solution of ceric ammonium nitrate and acetic acid.

During Step S105, remaining photoresist film PM on the piezoelectric wafer 50 is removed, and a new film of photoresist is applied to the entire piezoelectric wafer 50 to form a new the photoresist film PM. See FIG. 4(E).

FIG. 5 is a flow-chart of a process for etching the piezoelectric wafer 50. FIG. 5 begins where FIG. 4 left off. FIGS. 5(A)-5(F) are respective cross-sections of the piezoelectric board AK along the line F-F in FIG. 3A to show the process by which the piezoelectric boards AK are formed.

Step S201 directly follows Step S105 in FIG. 4(E). During Step S201 the photoresist film PM formed in FIG. 4E is exposed to light. See FIG. 5(A). Exposure is done using a photomask (not shown) to form the desired pattern of the supporting arms 13, the through-channel 52, and the excitation grooves 16. The exposed portions are denoted RB in the film PM of photoresist. In FIGS. 5(A)-5(F) the exposed portion RB is indicated by hatching.

During Step S202, the photoresist film PM is developed to remove the exposed portion RB. See FIG. 5(B).

During Step S203, the piezoelectric wafer 50 is etched. See FIG. 5(C). Etching continues depthwise from both sides to reduce the thickness of areas in which the through-channels 52 are formed to T1, wherein T1<2(D3). D3 is the depth of the excitation groove 16. See FIG. 1B. Etching of the piezoelectric wafer 50 can be performed by wet-etching using 55% hydrofluoric acid, buffered hydrofluoric acid (a mixture of hydrofluoric acid and ammonium fluoride), or the like.

During Step S204, the Au layer and Cr layer are etched. See FIG. 5(D). Etching of these layers is performed in same manner as used in Step S104. Since the photoresist film on the supporting arms 13 and the excitation grooves 16 has already been removed, the metal layers to be etched are the metal layers formed on the supporting arms 13 and excitation grooves 16.

During Step S205, the piezoelectric wafer 50 is wet-etched, followed by removal of the photoresist film PM on the piezoelectric wafer 50. See FIG. 5(E). Since the piezoelectric wafer 50 is etched to the depth D3 of the excitation grooves 16, the outer shape of the piezoelectric vibrating piece 100 is completed by forming the through-channel 52. Simultaneously, the thickness of the supporting arms 13 and of the excitation grooves 16 is formed to D2. See the hatched area in FIG. 2B.

During Step S206, the Au and Cr layers are removed. See FIG. 5(F). The piezoelectric board AK in FIG. 5F is the cross-section of AK along the line F-F in FIG. 3B. After the step shown in FIG. 5(F), electrodes are formed on the piezoelectric board AK, followed by cutting the piezoelectric vibrating pieces 100 from the piezoelectric wafer 50.

In the above-described method for forming the piezoelectric board AK of the piezoelectric vibrating piece 100, forming the thin supporting arms 13 is performed simultaneously with formation of the excitation grooves 16. Thus, adjustment of the thickness of the supporting arms 13 can be done in the same process step in which the excitation grooves 16 are formed.

First Example of Different Shapes of Supporting Arms

The supporting arms 13 can have a shape different from that of the supporting arms 13 of the piezoelectric vibrating piece 100. This example is described with reference to FIGS. 6A-6F.

Figure 6:
FIG. 6A is a schematic cross-sectional view of a first example of the first embodiment of a piezoelectric vibrating piece.
FIG. 6B is a schematic cross-sectional view of a second example of the first embodiment of a piezoelectric vibrating piece.
FIG. 6C is a schematic cross-sectional view of a third example of the first embodiment of a piezoelectric vibrating piece.
FIG. 6D is a schematic cross-sectional view of a fourth example of the first embodiment of a piezoelectric vibrating piece.
FIG. 6E is a plan view of a fifth example of the first embodiment of a piezoelectric vibrating piece.
FIG. 6F is a cross-sectional view, along the line G-G in FIG. 6E, of the fifth example of the first embodiment of a piezoelectric vibrating piece.

FIG. 6A is a schematic cross-section of the piezoelectric vibrating piece 100. The thickness D4 of the supporting arms 13 is greater than the thickness D2 of the excitation grooves 16 and less than the thickness D1 of the vibrating arms 12. Since the thickness of the supporting arms 13 is not equal to the thickness of the vibrating arms 12, the frequencies of spurious vibrations can shifted away from the frequencies of main vibrations. Hence, it is desired that the thickness of the supporting arms 13 be as different from the thickness of the vibrating arms 12 as possible to maximize the difference in these frequencies from each other. In this regard, the supporting arms 13 should be made thinner. On the other hand, whenever the thickness of the supporting arm 13 is decreased, the strength of the supporting arm 13 is compromised. Hence, the offsetting issues of supporting-arm strength versus production of spurious vibrations should be considered when establishing the thickness of the supporting arm 13. The thickness D4 of the supporting arms 13 of the piezoelectric vibrating piece 100 is a result of consideration of both these issues. Depending on the thickness D2 of the vibrating arms 12 at the excitation grooves 16, the thickness D4 of the supporting arms 13 may be less than the thickness D2.

Method for Manufacturing Piezoelectric Vibrating Piece

The piezoelectric vibrating piece 110 is manufactured by using a method different from the method described in the flow chart of FIG. 5. This is because the thickness D4 of the supporting arms 13 and the thickness D2 of the vibrating arms 12 at the excitation grooves 16 are not equal.

FIG. 7 is a flow-chart of a method for manufacturing the piezoelectric vibrating piece 110. FIGS. 7(A)-7(F) show the results of corresponding steps in FIG. 7.

Step S301 directly follows Step S105 in FIG. 4. In Step S301 the photoresist PM is exposed to light using a photo mask (not shown) defining the pattern of the through-channels 52 and the excitation grooves 16. The exposure forms the exposed regions RB of the photoresist film PM. See FIG. 7(A), in which the exposed regions RB are denoted by hatching.

In Step S302 the photoresist film PM is developed to remove the exposed regions RB. The piezoelectric wafer 50 is then etched to form the through-channels 52. See FIG. 7(B). When etching the piezoelectric wafer 50, the thickness of the piezoelectric wafer 50 at the through-channels 52 can be either T1, as shown in FIG. 5(C), or the fully penetrating through-channels 52 can be formed.

During Step S303, the Au and Cr layers in the excitation grooves 16 are etched, and the piezoelectric wafer 50 is etched at the locations of the excitation grooves 16. See FIG. 7(C). The piezoelectric wafer 50 is etched only to a residual thickness of T2, wherein T2<D3.

During Step S304, all the photoresist film remaining on the piezoelectric wafer 50 after Step S303 is removed, and a new film of photoresist is applied to the piezoelectric wafer 50. The newly formed photoresist film is exposed to light using a photo mask (not shown) defining the pattern of the supporting arms 13, the through-channel 52, and the excitation grooves 16. Exposed regions RB are formed in the photoresist film PM. See FIG. 7(D), in which the exposed regions RB are denoted by hatching.

In Step S305 the photoresist film PM is developed, the Au and Cr layers on the supporting arms 13 are etched, and the piezoelectric wafer 50 in the regions of the supporting arms 13 and excitation grooves 16 are etched only to the thickness T3. See FIG. 7(E), in which the depth D3 of each excitation groove 16 is the sum of the etched thickness T2 of the piezoelectric wafer at Step S303 and the etched thickness T3 of the piezoelectric wafer at Step S305, wherein D1=T3×2+D4.

In Step S306 the remaining photoresist film PM and layers of Au and Cr are removed. See FIG. 7(F), which is similar to FIG. 6A.

With the method for manufacturing piezoelectric vibration pieces 110 as described above, a single formation of the Au and Cr metal layers can be used to form the supporting arms 13 and the excitation grooves 16 having different respective thicknesses.

Second Example of Different Shapes of Supporting Arms

Referring again to FIG. 6B, another example of supporting arms 13 having a different shape is now described. FIG. 6B is a schematic cross-section of the piezoelectric vibrating piece 120. In this piezoelectric vibrating piece 120, a plane on the −Z-axis side of the supporting arms 13 is at the same position in the Z-axis direction as the plane on the −Z-axis of either the vibrating arms 12 or the base 11. Whenever the thickness D5 of the supporting arms 13 of the piezoelectric vibrating piece 120 is equal to the sum of D3 (depth of the excitation grooves 16) plus D2 (thickness of the vibrating arms in the excitation grooves 16), the piezoelectric vibrating piece 120 can be manufactured by not exposing the plane on the −Z-axis side of the supporting arms 13 to light at Step S201 in FIG. 5. For the manufacturing process of the piezoelectric vibrating piece 120 in other instances, the piezoelectric vibrating piece 120 can be manufactured by not exposing the plane on the −Z-axis side of the supporting arms 13 to light at Step S304 in FIG. 7 and by adjusting the etching of T2 and T3 so that D5=D1−T2−T3 is satisfied. A piezoelectric vibrating piece 120 in another configuration, in which the +Z-axis position of the supporting arms 13 is consistent with the plane being on the +Z-axis of either the vibrating arms 12 or the base 11, can be manufactured in the same way.

FIG. 6B is a schematic cross-section of another example of the piezoelectric vibrating piece 130. The thickness D6 of the supporting arms 13 of the piezoelectric vibrating piece 130 is greater than the thickness D1 of the base 11. The frequencies of spurious vibrations can be shifted further away from the frequencies of the main vibrations by making the thickness of the supporting arms 13 greater than the thickness of the base 11. There are two major approaches to making the thickness of the supporting arms 13 greater than the thickness of the vibrating arms 12. One approach is to affix piezoelectric material CR to the vibrating arms 12. The other approach is to decrease the thickness of the vibrating arms 12 smaller. Both approaches result in the thickness of the supporting arms not being equal to the thickness of the vibrating arms. This shifts the frequencies of spurious vibrations away from the frequencies of the main vibrations, thereby reducing adverse effects of the spurious vibrations on the main vibrations.

FIG. 6D is a schematic cross-section of another example of the piezoelectric vibrating piece 140. In this piezoelectric vibrating piece 140, the thickness of the supporting arms 13 is reduced, and side walls 19 on the supporting arms 13 are formed extending in the Z-direction. In this example 140, the thickness of the supporting arms 13 is denoted D1 and the thickness of the supporting arms 13 (excluding side walls 19) is denoted D7. If the supporting arms 13 do not have the side walls 19 and the thickness of the supporting arms 13 is only D7, then the strength of both decreases. However, the existence of side walls 19 increases the strength of the supporting arms 13.

This example of a piezoelectric vibrating piece 140 can be manufactured according to the method shown as a flow-chart in FIG. 7. In Step S301, the photoresist film PM formed on the excitation grooves 16 is not exposed to light, while the photoresist film PM formed on the supporting arms 13 on the +Z-axis side (excluding the side walls 19) is exposed to light. The supporting arms 13 excluding the side walls 19 are etched twice (first at Step S303 and second at Step S305) to form grooves hereafter referred to as "supporting arm grooves." By etching the supporting arms 13 twice, their thickness (excluding the side walls 19) is readily adjusted to D7.

For the supporting arms 13 of this piezoelectric vibrating piece 140, the thickness of the side walls 19 can be adjusted to D1 or less. The cross-sectional profile of the supporting arms 13 can have any of various other shapes including L-shaped and U-shaped in addition to the reverse T-shape depicted in FIG. 6D. These other shapes are readily produced by adjusting the forming position, depth, etc., of the supporting arm grooves.

FIG. 6E is a plan view of yet another example of a piezoelectric vibrating piece 150. In this piezoelectric vibrating piece 150, a thinner area AR2 (with thickness D8 and length L2) is formed in the center of each supporting arm 13 halfway in the Y-direction. The hatched regions in FIG. 6E are different from the hatched regions in FIG. 1A. The hatched regions in FIG. 6E denote regions having thickness D8.

FIG. 6F is a cross-section of the piezoelectric vibrating piece 150 along the line G-G in FIG. 6E. In this piezoelectric vibrating piece 150, the thickness of the distal end of each supporting arm 13 on the +Y-axis side that is connected to the connecting electrode SD (see FIG. 2C) of the package PK has a thickness D1 that is equal to the thickness of the base 11. Also, thinner regions AR2 are formed that have the thickness D8 and length L2. If the supporting arms 13 have some part having a thickness different from the thickness of the base 11, the frequencies of spurious vibrations can shifted away from the frequencies of the main vibrations. Also, the vibration leakage (acoustic leakage) from the vibrating arms 12 to the distal ends of the supporting arms 13 is reduced.

Second Embodiment of Piezoelectric Vibrating Piece

Figure 8A:
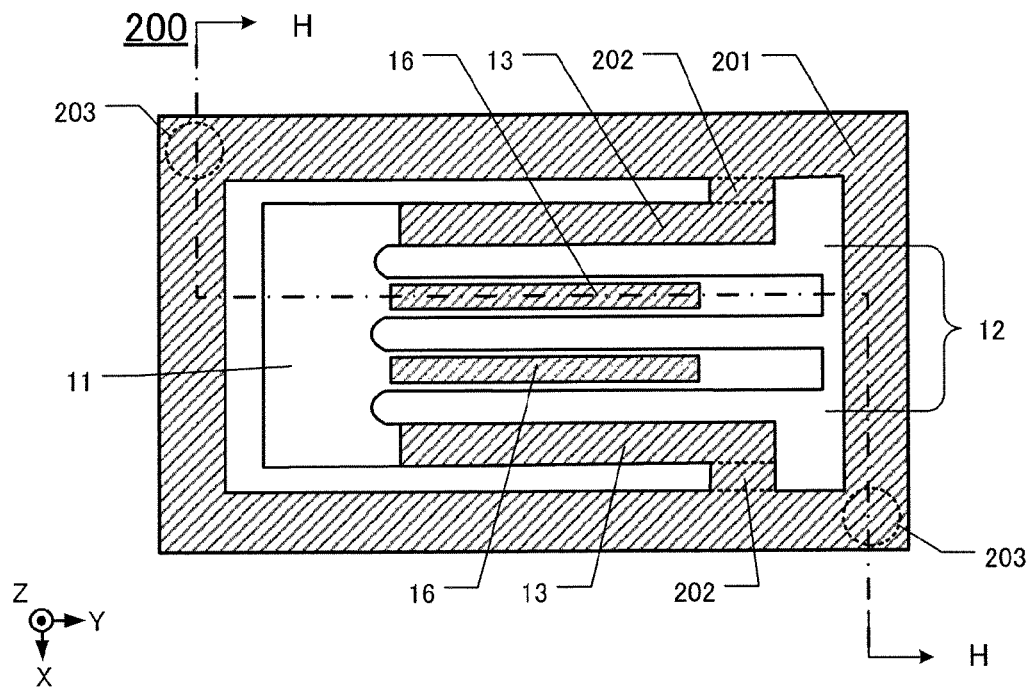
FIG. 8A is a plan view of a second embodiment of a piezoelectric vibrating piece.
Figure 8B:
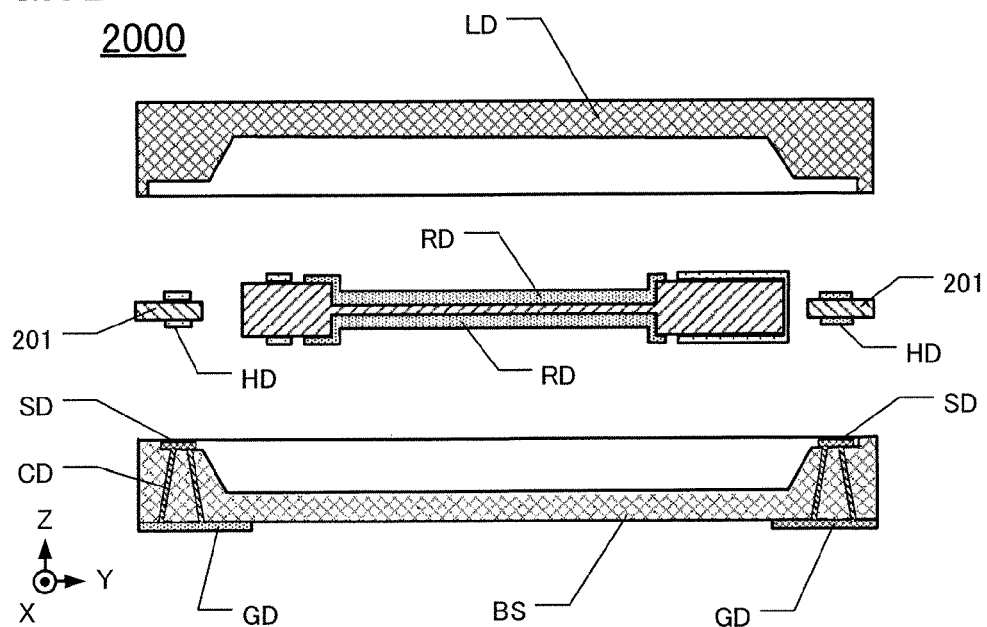
FIG. 8B is an exploded cross-sectional view, along the line H-H in FIG. 8A, of a piezoelectric device including the piezoelectric vibrating piece of FIG. 8A.

This embodiment is similar to the first embodiment in that the piezoelectric vibrating piece includes supporting arms. In this second embodiment, the piezoelectric vibrating piece is circumferentially surrounded by a frame body, as shown in FIG. 8A. FIG. 8A is a plan view of the piezoelectric vibrating piece 200, which includes a frame body 201. The frame body 201 is connected to the distal ends of the supporting arms 13 via connecting arms 202. Also, the respective thicknesses of the supporting arms 13, the connecting arms 202, the frame body 201, and the excitation groove 16 are less than the thickness of the base 11. In FIG. 8B the hatching denotes reduced-thickness regions of the piezoelectric vibrating piece 200.

The supporting arms 13 of this embodiment 200 can have the same shape and thickness as described above with reference to FIGS. 6A-6F. The frame body 201 and the connecting arms 202 can have any practical thickness so long as these parts have appropriate strength. The extraction electrodes HD (FIG. 8B) that are connected to respective excitation electrodes RD (FIG. 8B) formed on the vibrating arms 12 are connected to electrode-connecting portions 203 located in respective corners of the frame body 201 via the supporting arms 13 and the frame body 201. These electrode-connecting portions 203 are connected to the connection electrodes SD (FIG. 8B) affixed to the base plate BS. By forming the supporting arms 13 that are thinner than the vibrating arms 12, greater differences can be established between the frequencies of spurious vibrations generated at the supporting arms 13 and the frequencies of main vibrations generated at the vibrating arms 12.

FIG. 8B is an exploded cross-sectional view of a piezoelectric device 2000 along the line H-H in FIG. 8A. The piezoelectric device 2000 is formed by sandwiching a piezoelectric vibrating piece 200 between a lid LD (having a concavity in its inner main surface) and a base plate BS (having a concavity in its inner main surface. Extraction electrodes HD, located at respective electrode-connecting portions 203 of the frame body 201, are connected to respective connecting electrodes SD formed on the base plate BS. Since the connecting electrodes SD are connected to respective external electrodes GD formed on the outside main surface of the base plate BS via conductive portions CD, the excitation electrodes RD of the piezoelectric vibrating piece 200 is electrically connected to the external electrodes GD. The lid LD, the base plate BS, and the frame body 201 are bonded together by siloxane bonds, which seal the interior of the piezoelectric device 2000.

With these piezoelectric devices 2000 in which the piezoelectric vibrating pieces have respective frame bodies 200, adverse effects of spurious vibrations of the supporting arms 13 on the vibrating arms 12 can be reduced by making the thickness of the supporting arms 13 different from the thickness of the base 11.

Third Embodiment of Piezoelectric Vibrating Piece

FIGS. 6A-6F show piezoelectric vibrating piece comprising supporting arms 13 in various respective shapes. The adverse effects of spurious vibrations of the supporting arms 13 on the main vibrations produced by the piece can be reduced by altering the shape of the supporting arms 13. CI values can be reduced by strengthening the adhesion between the supporting aims 13 and the respective connecting electrodes SD. In FIGS. 9A-9C, respective piezoelectric vibrating pieces 300 are shown in which the supporting-arm grooves are formed on the supporting arms 13.

Fourth Embodiment of Piezoelectric Vibrating Piece

This embodiment is shown in FIG. 9A, which is a plan view of the piezoelectric vibrating piece 300. Supporting-arm grooves 301 are formed in the vicinity of the distal ends of the supporting arms 13. The supporting arms 13 (in which supporting-arm grooves 301 have been formed) are thinner than the thickness D1 of the base 11. Hatching in FIG. 9A denote regions in which thickness is less than the thickness D1 of the base 11. The supporting-arm grooves 301 are 70 to 300 μm in length L3 in the Y-direction and 50 to 100 μm in width W2 in the X-direction.

FIG. 9B is a cross-section of the piezoelectric vibrating piece 300 along the line I-I of FIG. 9A. The supporting-arm grooves 301 are in the vicinity of the distal ends of the supporting arms 13. Each supporting-arm groove 301 includes respective side walls 19 on each of the +X and −X sides thereof.

FIG. 9C is a cross-section of the piezoelectric vibrating piece 300 along the line J-J in FIG. 9A. Respective side walls 19 are situated at the distal ends of the supporting-arm grooves 301 and extend in the Y-direction to the piezoelectric vibrating piece in the Y-direction. Briefly, each supporting-arm groove 301 is enclosed by side walls 19 along each of its four sides.

Second Embodiment of Piezoelectric Device

Figure 10A:
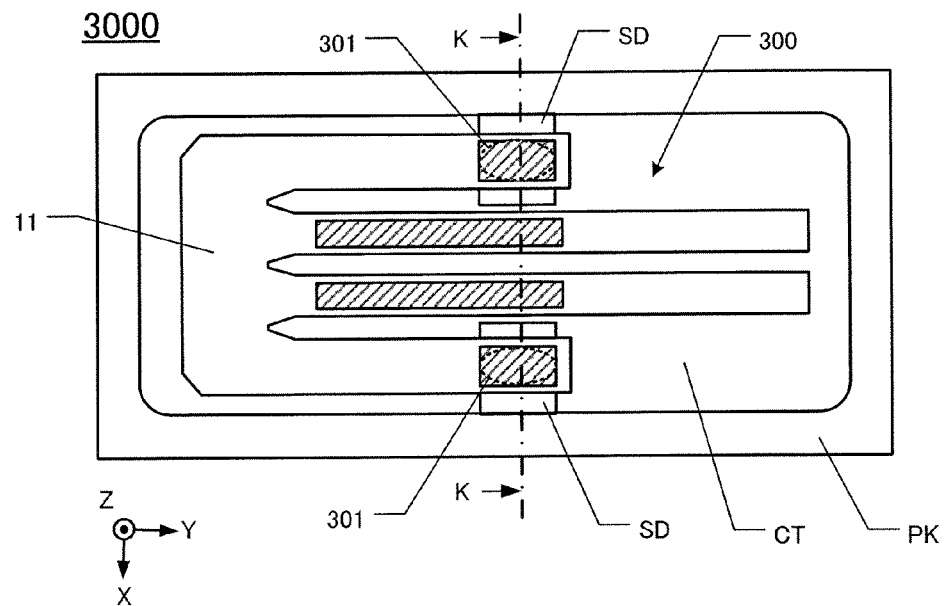
FIG. 10A is a cross-sectional view of an embodiment of a piezoelectric device as viewed from the +Z-axis to the −Z-axis.
Figure 10B:
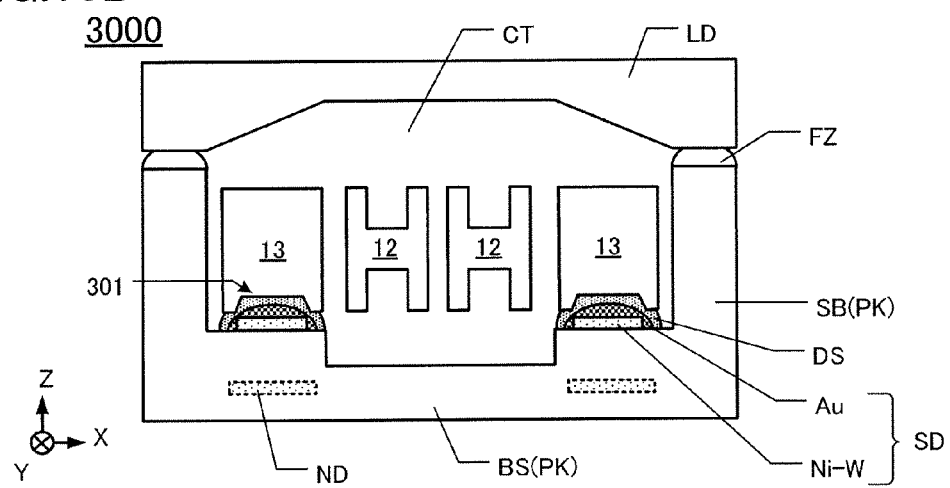
FIG. 10B is a cross-sectional view, along the line K-K in FIG. 10A, of the piezoelectric device in FIG. 10A.

This embodiment of a piezoelectric vibrating device 3000 comprises the piezoelectric vibrating piece 300. Referring to FIGS. 10A-10B, features of the piezoelectric device 3000 are described. FIG. 10A is a cross-section of the piezoelectric device 3000 as viewed from a location on the +Z-axis toward the −Z-axis. Hatching in FIG. 10A denotes regions in which the thickness of the piezoelectric vibrating piece 100 is different from the thickness D1. The piezoelectric vibrating piece 300 is mounted by connecting the supporting arm grooves 301 to the connecting electrodes SD in the cavity CT defined by the package PK.

FIG. 10B is a cross-section of the piezoelectric device 3000 along the line K-K in FIG. 10A. A cavity CT is defined by bonding together the package PK to the lid LD using a sealant FZ. A piezoelectric vibrating piece 300 is situated in the cavity CT. The package PK comprises the base plate BS. The connecting electrodes SD are situated in the cavity CT of the package PK. The connecting electrodes SD comprise a nickel-tungsten (Ni—W) layer on which a gold layer has been formed. The Ni—W layer can be formed by, for example, screen-printing; and the Au layer can be formed by electroplating. Inner electrodes ND are formed in the base plate BS. The connecting electrodes SD are electrically connected to the external electrodes (not shown) via respective inner electrodes ND.

The supporting-arm grooves 301 of the piezoelectric vibrating piece 300 are bonded to respective connecting electrodes SD of the package PK using electrically conductive adhesive DS. Since the supporting arms 13 have respective grooves 301, the areas in which to apply the conductive adhesive DS are increased relative to areas provided when supporting-arm grooves 301 are not formed. Thus, the strength with which the piezoelectric vibrating piece 300 is assembled is enhanced. To enhance the bonding strength of the piezoelectric vibrating piece 300, it is desirable that the area of the supporting arm grooves 301 enclosed by the side walls 19 be a bit larger than the connecting electrodes SD.

Example of the Different Shape of the Piezoelectric Vibrating Piece 300

FIGS. 11A-11D show examples of the piezoelectric vibrating piece 300 of which the shape is slightly changed. The hatching in FIGS. 11A and 11C denote regions of which the thickness is different from the thickness D1 of the piezoelectric vibrating piece 310 or the piezoelectric vibrating piece 320.

Figure 11A:
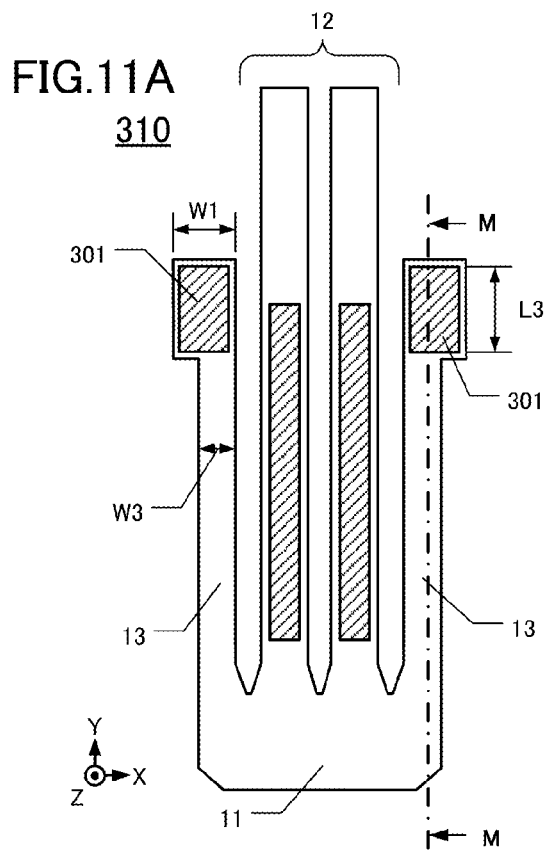
FIG. 11A is a plan view of a first example of the third embodiment of a piezoelectric vibrating piece.

FIG. 11A is a plan view of the piezoelectric vibrating piece 310. In the piezoelectric vibrating piece 310, the supporting-arm grooves 301 are formed in the vicinity of the distal ends of the supporting-arm grooves 301; the width W3 of each supporting arm 13 in the X-direction (but excluding the supporting-arm grooves 301) is less than the width W1 of the distal end. Thus, the vibration leakage (acoustic leakage transferred from the supporting arms 13 to the vibrating arms) can be reduced.

Figure 11B:
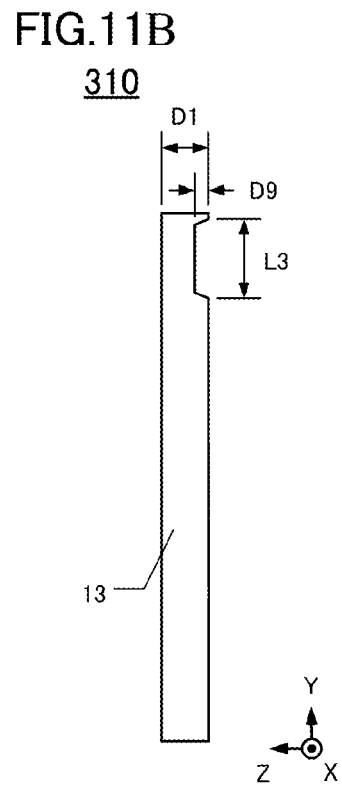
FIG. 11B is a cross-sectional view, along the line M-M in FIG. 11A, of the first example shown in FIG. 11A.

FIG. 11B is a cross-section of the piezoelectric vibrating piece 310 along the line M-M in FIG. 11A. The supporting-arm grooves 301 are situated in the vicinity of the distal ends of respective supporting arms 13. The thickness of the supporting arms 13 in regions not occupied by supporting-arm grooves 301 is denoted D1.

Figure 11C:
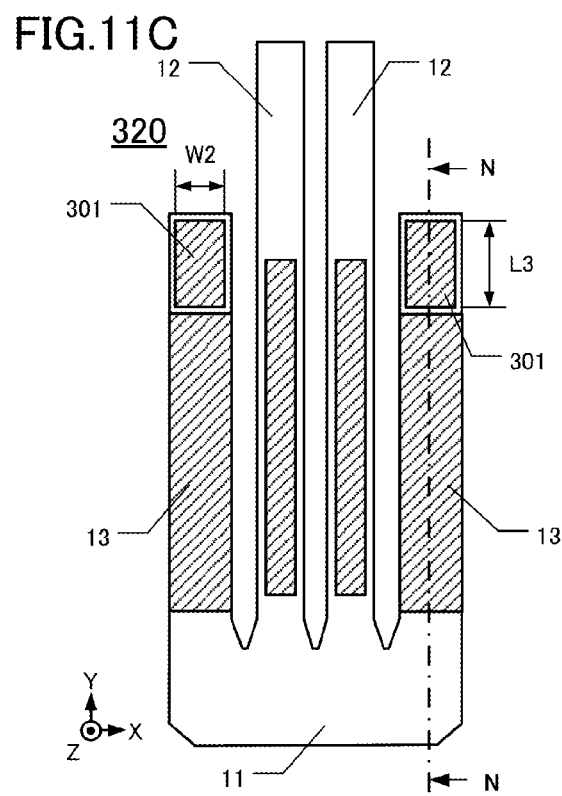
FIG. 11C is a plan view of a second example of the third embodiment of a piezoelectric vibrating piece.

FIG. 11C is a plan view of a piezoelectric vibrating piece 320. The thickness of the supporting arms 13 is reduced, and the supporting-arm grooves 301 are situated in the vicinity of the distal ends of the supporting arms 13. Adverse effects of spurious vibrations are reduced by forming the supporting arms 13 thinner than the base 11. CI values can be reduced by connecting to the connecting electrodes SD at the supporting-arm grooves 301.

Figure 11D:
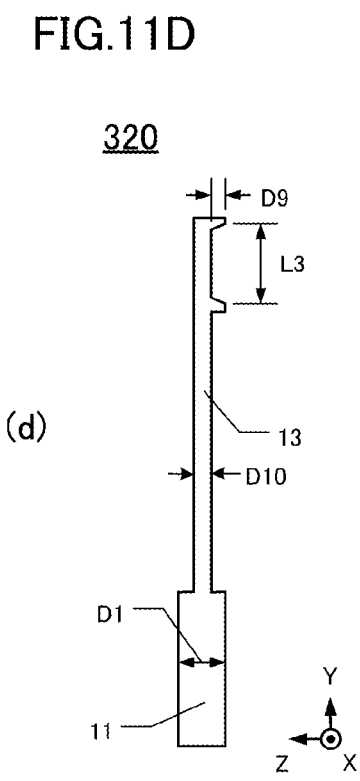
FIG. 11D is a cross-sectional view, along the line N-N in FIG. 11C, of the second example shown in FIG. 11C.

FIG. 11D is a cross-sectional view of the piezoelectric vibrating piece 320 along the line N-N in FIG. 11C. The thickness D10 of the supporting arms 13 is less than the thickness of the base 11. The supporting-arm grooves 301 are in the vicinity of the distal ends of respective supporting arms 13.

This disclosure is a detailed description of various representative embodiments that are not intended to be limiting. A person of ordinary skill in the art will readily understand that any of the described embodiments can be changed or modified while remaining within the spirit and scope of the invention.

What is claimed is:

1. A piezoelectric vibrating piece, comprising:
   a base fabricated of piezoelectric material;
   a pair of vibrating arms extending straight from the base in a designated longitudinal direction, the vibrating arms having a first thickness; and
   a respective supporting arm extending straight from the base and outboard of each vibrating arm in the designated longitudinal direction, each supporting arm including at least a respective second region having a second thickness different from the first thickness, the second regions extending entirely over the respective supporting arms.

2. The piezoelectric vibrating piece of claim 1, further comprising:
   a frame body circumferentially surrounding the supporting arms and base; and
   integral with each supporting arm, a respective connecting arm connecting the respective supporting arm to the frame body.

3. The piezoelectric vibrating piece of claim 1, wherein:
   each vibrating arm includes at least one respective excitation groove extending in the designated direction on a main surface of the vibrating arm;
   each excitation groove comprises a respective excitation electrode formed therein; and
   each supporting arm comprises a respective extraction electrode connected to the respective excitation electrode, the extraction electrode extending from the base to a respective distal end of the respective supporting arm.

4. The piezoelectric vibrating piece of claim 1, wherein the second thickness is less than the first thickness.

5. The piezoelectric vibrating piece of claim 4, wherein:
   each vibrating arm includes at least one respective excitation groove extending straight in the designated direction on a main surface of the vibrating arm;
   each excitation groove comprises a respective excitation electrode formed therein; and
   each supporting arm comprises a respective extraction electrode connected to the respective excitation electrode, the extraction electrode extending from the base to a respective distal end of the respective supporting arm.

6. The piezoelectric vibrating piece of claim 4, further comprising:
   a frame body circumferentially surrounding the supporting arms and base; and
   integral with each supporting arm, a respective connecting arm connecting the respective supporting arm to the frame body.

7. A method for manufacturing a piezoelectric piece including a base fabricated of piezoelectric material, a pair of vibrating arms extending straight from the base in a designated longitudinal direction, the vibrating arms having a first thickness, and a respective supporting arm extending straight from the base and outboard of each vibrating arm in the designated longitudinal direction, the method comprising:
   forming a respective excitation groove on each vibrating arm, each excitation groove providing a respective region on the vibrating arm having the second thickness that is less than the first thickness; and
   on each supporting arm, forming a respective second thickness region having the second thickness, wherein the second thickness regions extend entirely over the respective supporting arms.

8. The method of claim 7 wherein:
   each step is performed simultaneously with the other step; and
   each step is performed by etching.

* * * * *